(12) United States Patent
Komiya

(10) Patent No.: US 8,679,978 B2
(45) Date of Patent: Mar. 25, 2014

(54) METHOD FOR FORMING A FILM INCLUDING ZR, HF OR THE LIKE, AND METHOD FOR MANUFACTURING A SEMICONDUCTOR DEVICE USING THE SAME

(75) Inventor: Takayuki Komiya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/273,594

(22) Filed: Oct. 14, 2011

(65) Prior Publication Data

US 2012/0094483 A1  Apr. 19, 2012

(30) Foreign Application Priority Data

Oct. 15, 2010 (JP) ................. 2010-232276

(51) Int. Cl.
*H01L 21/44* (2006.01)

(52) U.S. Cl.
USPC ..... 438/685; 438/656; 438/653; 257/E23.163

(58) Field of Classification Search
USPC ................. 257/E23.163; 438/653, 656, 685
See application file for complete search history.

(56) References Cited

U.S. PATENT DOCUMENTS 5,856,236 A * 1/1999 Lai et al. ................ 438/681
2010/0068891 A1 * 3/2010 Hatanaka et al. ........ 438/758

FOREIGN PATENT DOCUMENTS

| JP | 2006-57162 A | 3/2006 |
| JP | 2008-98521 A | 4/2008 |
| JP | 2008-98522 A | 4/2008 |
| KR | 10-2009-0067201 A | 6/2009 |

OTHER PUBLICATIONS

Sung, J., et al., "Remote-plasma chemical vapor deposition of conformal ZrB2 films at low temperature: A promising diffusion barrier for ultralarge scale integrated electronics", Journal of Applied Physics, vol. 91, No. 6, pp. 3904-3911, (Mar. 15, 2002).

* cited by examiner

*Primary Examiner* — Robert Huber
(74) *Attorney, Agent, or Firm* — Nath, Goldberg & Meyer; Jerald L. Meyer (57) ABSTRACT

A method for forming a film includes the steps of: placing an object to be processed into a processing container; and generating $M(BH_4)_4$ gas by feeding $H_2$ gas as carrier gas into a raw material container in which solid $M(BH_4)_4$ (where M is Zr or Hf) is accommodated to introduce a mixture gas of $H_2$ gas and $M(BH_4)_4$ gas having a volume ratio of flow rates ($H_2/M(BH_4)_4$) of 2 or more into the processing container, and deposit a $MB_x$ film (where M is Zr or Hf and x is 1.8 to 2.5) on the object using a thermal CVD.

6 Claims, 11 Drawing Sheets

METHOD FOR FORMING A FILM INCLUDING ZR, HF OR THE LIKE, AND METHOD FOR MANUFACTURING A SEMICONDUCTOR DEVICE USING THE SAME

CROSS-REFERENCE TO RELATED APPLICATION

This application claims the benefit of Japanese Patent Application No. 2010-232276, filed on Oct. 15, 2010, in the Japan Patent Office, the disclosure of which is incorporated herein in its entirety by reference.

TECHNICAL FIELD

The present disclosure relates to a film forming method and apparatus for use in manufacturing a semiconductor device, and a method for manufacturing a semiconductor device.

BACKGROUND

Zr compound films such as ZrN films, $ZrB_2$ films and the like have been used for barrier films against diffusion of high melting point metal compounds used to form films in a process of manufacturing a semiconductor device. A Zr compound is promising for a conductive barrier film because of its low bulk resistivity of 10 μΩcm. In addition, it has been proposed to use a Zr compound for a conductive cap film, which is unnecessary to be eliminated, based on the property that its resistivity is extremely varied depending on the type of a base film.

In addition, a method has been proposed to form a ZrN film by a thermal chemical vapor deposition (CVD). However, this method needs to pay attention to high resistance due to residual carbon and generation of insulative compounds such as $Zr_3N_4$ and the like since a film formation temperature is above 300° C. or an alkylamino-based compound or the like is used as a raw material, which contains carbon.

On the other hand, regarding the formation of a $ZrB_2$ film, a technique has been proposed for forming a film using a CVD or an atomic layer deposition (ALD) by using $Zr(BH_4)_4$ as a raw material and introducing $H_2$ gas or $NH_3$ gas excited by plasma into a processing container.

However, a conventional technique is known that requires a remote plasma equipment to introduce atomic H or the like into the processing container. This makes a configuration of a film forming apparatus complicated, which is inappropriate for industrial applicability in a semiconductor process. In addition, in the above technique, a B/Zr ratio in the $ZrB_2$ film formed using a thermal CVD with $Zr(BH_4)_4$ used as a raw material becomes excessive, which may result in a deterioration of film quality.

SUMMARY

According to one embodiment of the present disclosure, there is provided a method for forming a film, including: placing an object to be processed into a processing container; and generating $M(BH_4)_4$ gas by feeding $H_2$ gas as carrier gas into a raw material container in which solid raw material $M(BH_4)_4$ (where M is Zr or Hf) is accommodated to introduce a mixture gas of $H_2$ gas and $M(BH_4)_4$ gas having a volume ratio of flow rates $(H_2/M(BH_4)_4)$ of 2 or more into the processing container, and deposit a $MB_x$ film (where M is Zr or Hf and x is 1.8 to 2.5) on the object using a thermal CVD.

According to another embodiment of the present disclosure, there is provided an apparatus for forming a film, including: a processing container which can be made vacuous; a loading table which is placed in the processing container and loads an object to be processed; a heater which heats the object loaded on the loading table to a predetermined temperature; an exhauster which exhausts the interior of the processing container in a pressure reducing manner; a raw material container which holds solid raw material $M(BH_4)_4$ (where M is Zr or Hf); a temperature regulator which cools or heat-insulates the solid raw material in the raw material container; a $H_2$ gas feeder which feeds $H_2$ gas into the raw material container; and a gas feeding pipe through which a mixture gas of $H_2$ gas and $M(BH_4)_4$ gas is fed from the raw material container into the processing container; wherein the mixture of $H_2$ gas and $M(BH_4)_4$ gas is introduced while controlling a flow rate of the $M(BH_4)_4$ gas evaporated by the feeding of the $H_2$ gas and a volume ratio of flow rates $(H_2/M(BH_4)_4)$ of $H_2$ gas and $M(BH_4)_4$ gas by adjusting a flow rate of $H_2$ gas fed into the raw material container and an internal pressure of the raw material container, and a $MB_x$ film (where M is Zr or Hf and x is 1.8 to 2.5) is deposited on the object using a thermal CVD.

According to another embodiment of the present disclosure, there is provided a method for manufacturing a semiconductor device, including: depositing a $MB_x$ film (where M is Zr or Hf and x is 1.8 to 2.5), as a barrier film, on an insulating film of an object to be processed using the above-described film forming method; and depositing a metal film on the $MB_x$ film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Exemplary embodiments of the present disclosure will now be described in detail with reference to the drawings.
<General Configuration of Film Forming Apparatus>

Figure 1:
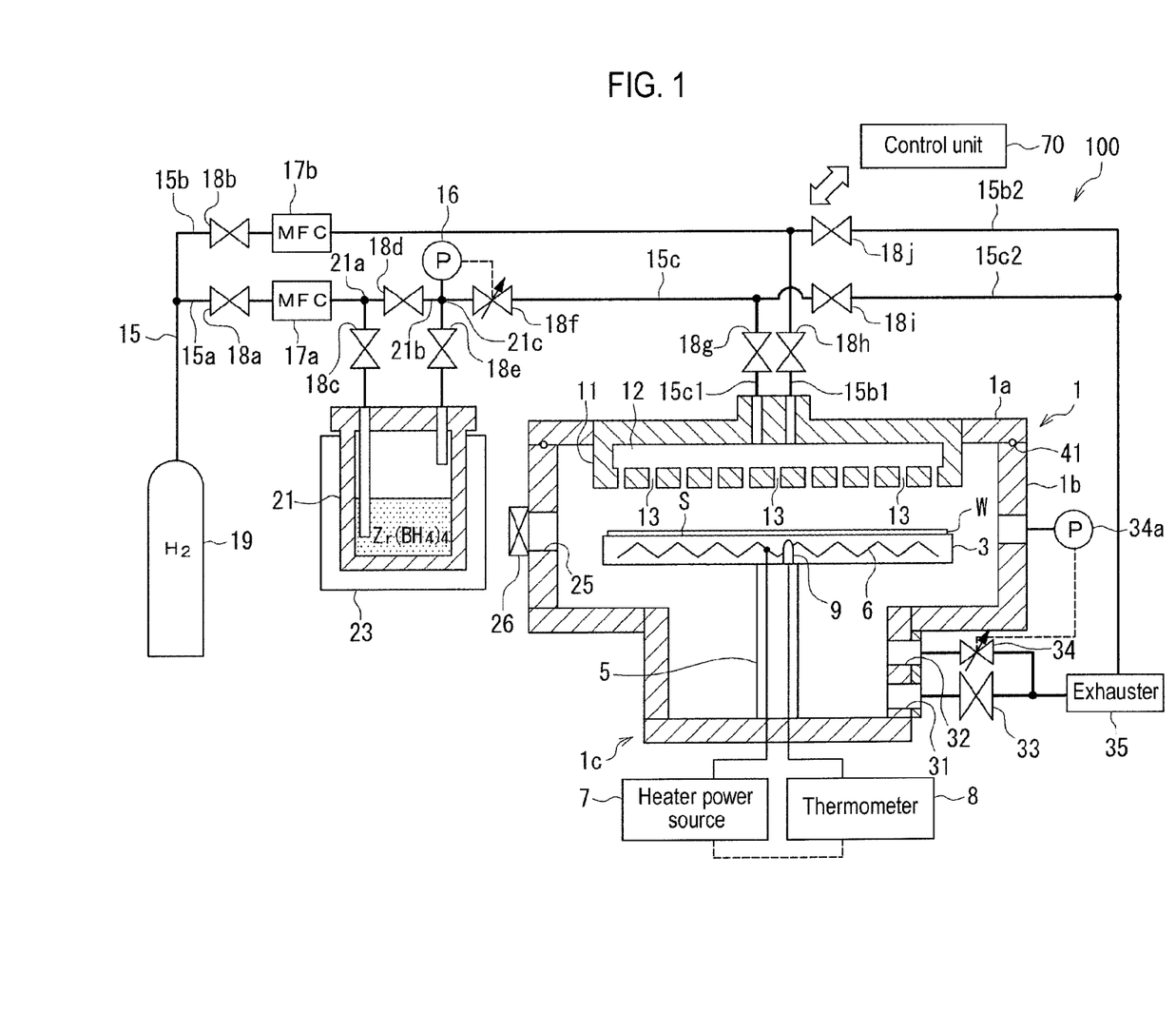
FIG. 1 is a sectional view showing a general configuration of a film forming apparatus for use with a film forming method according to an embodiment of the present disclosure.

First, a configuration of a film forming apparatus adapted for embodiments of a film forming method of the present disclosure is explained. FIG. 1 shows a general configuration of a film forming apparatus 100 for use with a film forming method according to an embodiment of the present disclosure. The film forming apparatus 100 is implemented by a thermal CVD apparatus. The film forming apparatus 100 may perform a film forming process of forming an $MB_x$ film (where M represents Zr or Hf and x represents a number of 1.8 to 2.5) on an insulating film such as a low-permittivity film or the like. This embodiment will be illustrated with a film including Zr as M, i.e., a $ZrB_x$ film (which may be indicated by a $ZrB_2$ film based on a stoichiometric ratio).

The film forming apparatus 100 has an airtight cylindrical processing container 1. The processing container 1 is made of material such as aluminum subjected to alumite treatment (i.e., anode oxidation). A stage 3, which is a loading table horizontally supporting a semiconductor wafer W to be processed (hereinafter abbreviated as a "wafer"), is arranged in the processing container 1. The stage 3 is supported by a cylindrical support member 5. A heater 6 as a heating means for heating the wafer W is buried in the stage 3. The heater 6 is a resistive heater to heat the wafer W to a predetermined temperature by feeding power from a heater power source 7. In addition, a thermocouple (TC) 9 and a thermometer 8, which constitute a temperature measuring means, are connected to the stage 3, whereby a temperature of the stage 3 is measured in real time and is fed back to the heater power source 7. Unless specifically stated, a heating temperature or a processing temperature of the wafer W refers to a temperature of a wafer W being processed, which is actually measured by a wafer with a then iocouple and is estimated based on the measurement. A heating means for heating the wafer may include, but is not limited to, a resistive heater and a lamp heater.

Although not shown, the stage 3 has a plurality of lift pins which support and lift up/down the wafer W and project from a substrate loading surface S of the stage 3. The plurality of lift pins are configured to be vertically dislocated by any lifting mechanism and to transfer the wafer W between the plurality of lift pins and a carrying device (not shown) at an ascending position.

A shower head 11 is placed on a ceiling plate 1a of the processing container 1. The shower head 11 has a gas diffusion space 12 defined therein. A plurality of gas discharge holes 13 is formed in the lower portion of the shower head 11. The gas diffusion space 12 communicates with the gas discharge holes 13. Gas feeding pipes 15b1 and 15c1 communicating with the gas diffusion space 12 are connected to the central portion of the shower head 11.

A gas source 19 feeds hydrogen ($H_2$) gas. The $H_2$ gas is used as carrier gas to evaporate $Zr(BH_4)_4$, which is a solid raw material, and carry the evaporated material into the processing container 1. The $H_2$ gas is also used to condition the interior of the processing container 1 before performing a film forming process. Although not shown, in addition to the gas source 19, the film forming apparatus 100 may include a cleaning gas source used to clean the interior of the processing container 1, a purge gas source used to purge the interior of the processing container 1, etc.

A gas feeding pipe 15 is connected to the gas source 19. The gas feeding pipe 15 branches into gas feeding pipes 15a and 15b on the way to the processing container 1. A mass flow controller (MFC) 17a to regulate a flow rate and a valve 18a placed between the gas source 19 and the MFC 17a are arranged on the gas feeding pipe 15a. A mass flow controller (MFC) 17b to regulate a flow rate and a valve 18b placed between the gas source 19 and the MFC 17b are arranged on the gas feeding pipe 15b.

A raw material container 21 is provided with a gas inlet 21a, a gas bypass pipe 21b, a gas outlet 21c, and valves 18c, 18d and 18e arranged in association therewith. The gas feeding pipe 15a is inserted and connected to the raw material container 21 accommodating the solid raw material $Zr(BH_4)_4$ through the valve 18c, so that $H_2$ gas can be fed into the raw material container 21. The raw material container 21 is a pressure-resistant container and its internal pressure can be adjusted with a manometer 16 and a pressure regulation valve 18f via the outlet valve 18e of the container. The raw material container 21 has a temperature regulator (a cooler or a thermostat) 23 such as, for example, a jacket heat exchanger, and is configured to cool and maintain $Zr(BH_4)_4$ accommodated therein to, for example, a temperature range of −15° C. to 5° C. Since $Zr(BH_4)_4$, has a melting point of 28.7° C., it remains solidified in the cool-reserved raw material container 21. If $H_2$ gas is maintained or circulated in the raw material container, $Zr(BH_4)_4$ may also be kept at 10 to 45° C. If $Zr(BH_4)_4$ is kept at 30° C. or more, it remains liquefied.

A gas feeding pipe 15c connected to the pressure regulation valve 18f, which is the outlet of the raw material container, branches into two pipes, that is, a gas feeding pipe 15c1 connected to the shower head 11 via a valve 18g and a gas feeding pipe 15c2 connected to an exhauster 35 via a valve 18i. The gas feeding pipe 15b connected to the mass flow controller (MFC) 17b branches into two pipes, that is, a gas feeding pipe 15b1 connected to the shower head 11 via a valve 18h and a gas feeding pipe 15b2 joining with the gas feeding pipe 15c2 via a valve 18j and connected to the exhauster 35.

In the film forming apparatus as configured above, $H_2$ gas is fed from the gas source 19 into the raw material container 21 via the gas feeding pipe 15a and contacts the cooled or cool-reserved $Zr(BH_4)_4$, thereby evaporating (or sublimating) $Zr(BH_4)_4$ from solid or liquid state. $H_2$ gas serving as carrier gas is fed into the gas diffusion space 12 of the shower head 11 via the gas feeding pipes 15c and 15c1 and may be discharged from the gas discharge holes 13 to the wafer W placed on the stage 3 in the processing container 1. In this embodiment, in this manner, $H_2$ gas acts as carrier gas as well as a part of film forming gas (i.e., mixture gas of $H_2$ gas and $Zr(BH_4)_4$ gas).

In addition, in the film forming apparatus 100, $H_2$ gas can also be fed from the gas source 19 into the gas diffusion space 12 of the shower head 11 via the gas feeding pipes 15b and 15b1 and into the processing container 1 through the gas discharge holes 13.

In the side wall 1b of the processing container 1 is formed an opening 25 through which the wafer W is carried in/out of the processing container 1 and provided a gate valve 26 for opening/closing the opening 25.

A main exhaustion hole 31 and an exhaustion hole 32 are formed in a side of the bottom wall 1c of the processing container 1. The exhauster 35 is connected to the main exhaustion hole 31 via a main exhaustion valve 33 and to the exhaustion hole 32 via a pressure regulation valve 34 which can be controlled by a manometer 34a disposed around the processing container 1. The exhauster 35 includes a vacuum pump, an exhaustion detoxification device (both of which are not shown) and so on and is configured to make the processing container 1 vacuous by exhausting the interior of the processing container 1.

An O-ring as a sealing member is disposed at a junction of each of member constituting the processing container 1 in order to secure airtightness of the junction. As a representative example, FIG. 1 shows an annular O-ring 41 disposed at a junction between the ceiling plate 1a and the side wall 1b. Although O-rings may be disposed at other portions, they will not be shown and described herein for the purpose of brevity.

Figure 2:
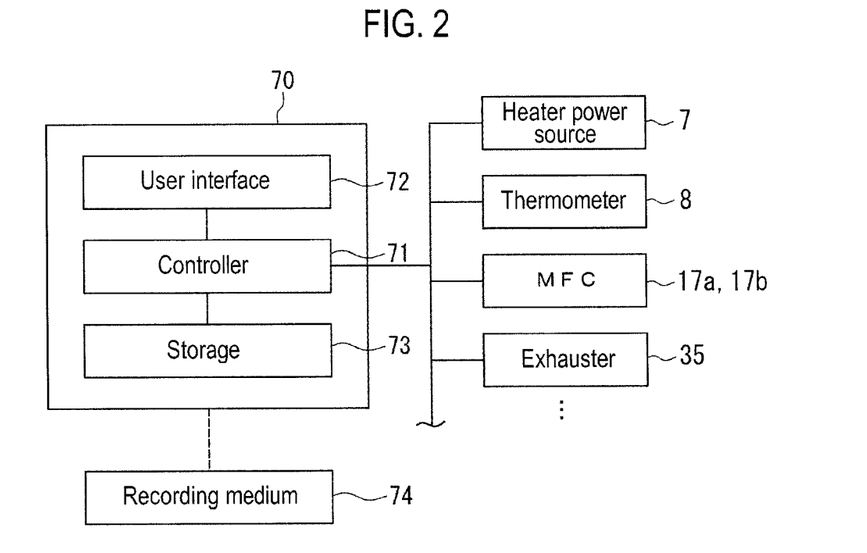
FIG. 2 is a block diagram showing a control system of the film forming apparatus of FIG. 1.

End devices (for example, the heater power source 7, the thermometer 8, the MFCs 17a and 17b, the exhauster 35 and so on) constituting the film forming apparatus 100 are connected to and controlled by a control unit 70. FIG. 2 shows an exemplary control system of the film forming apparatus 100. The control unit 70 includes a controller 71, which is a computer having a CPU, a user interface 72 connected to the controller 71, and a storage 73. The user interface 72 may include a keyboard and/or a touch panel for command input by an operator who manages the film forming apparatus 100, a display for visually displaying operation situations of the film forming apparatus 100, etc. The storage 73 stores a control program (software) to implement various kinds of processes performed by the film forming apparatus 100 under the control of the controller 71, recipes with processing condition data and so on. As needed, by reading a control program and a recipe from the storage 73 according to a command from the user interface 72 and causing the controller 71 to execute the read control program and recipe, a desired process is performed in the processing container 1 of the film forming apparatus 100 under the control of the controller 71.

The control program and the recipes with processing condition data may be used by installing those stored in a computer-readable recording medium 74 into the storage 73. Examples of the computer-readable recording medium 74 may include, but is not limited to, a CD-ROM, a hard disk, a flexible disk, a flash memory, a DVD and the like. The recipes may be downloaded on-line from other devices via a dedicated line, for example.

The above-configured film forming apparatus 100 performs a process of forming a $ZrB_x$ film using a CVD under the control of the control unit 70. As one example of the film forming process, a wafer W is first carried into the processing container 1 through the opening 25 with the gate valve 26 opened, and is then transferred to lift pins (not shown) of the stage 3. Then, the lift pins are descended to load the wafer W on the stage 3. Subsequently, the gate valve 26 is closed and the exhauster 35 is actuated to make the processing container 1 vacuous. In addition, the wafer W is heated to a predetermined temperature by the heater 6. Then, film forming gas is fed to the wafer W through the gas discharge holes 13 of the shower head 11. Thus, the $ZrB_x$ film can be formed on the surface of the wafer W.

<Film Forming Method>

Figure 3:
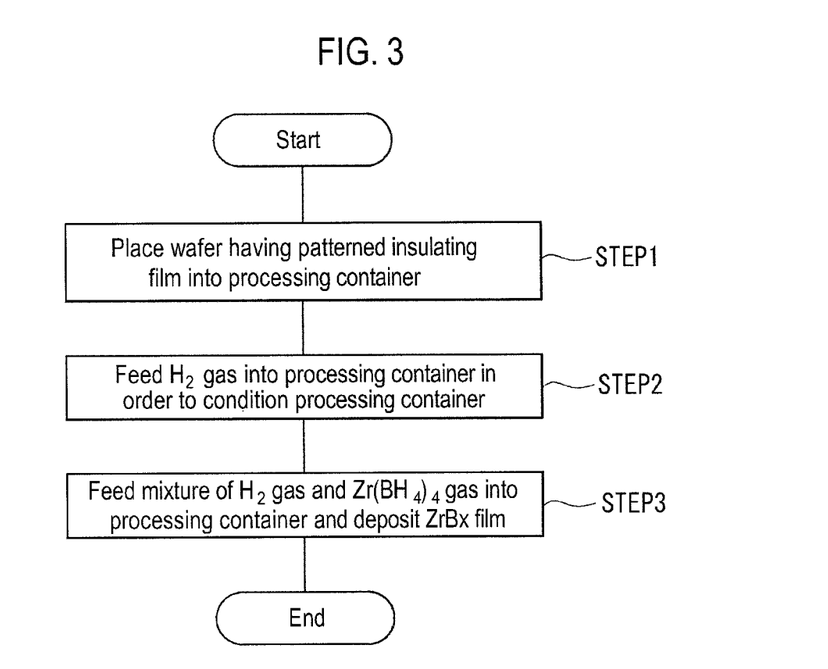
FIG. 3 is a flow chart showing an example film forming process according to an embodiment of the present disclosure.
Figure 4:
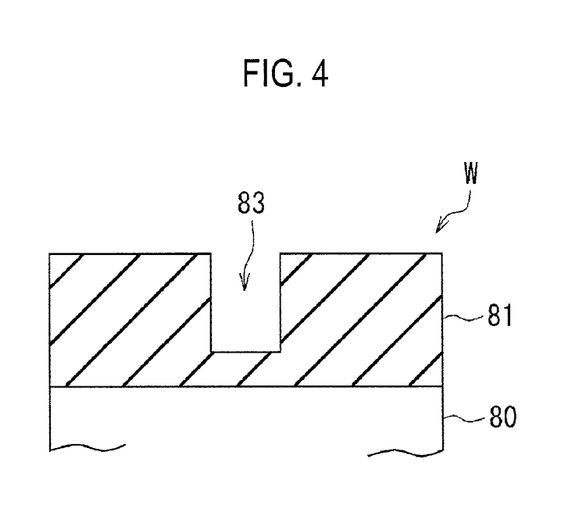
FIG. 4 is a sectional view showing a main portion of a wafer surface with a patterned insulating film formed thereon, which is used to explain a film forming process, according to an embodiment of the present disclosure.
Figure 5:
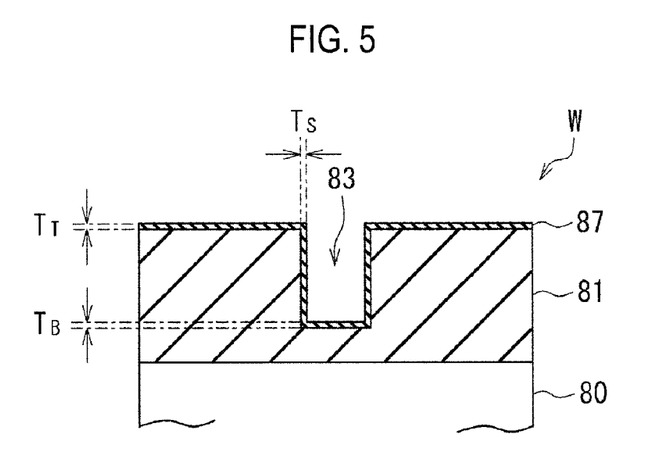
FIG. 5 is a continuation of FIG. 4, which is a sectional view showing a main portion of a wafer surface with a $ZrB_x$ film formed thereon.

Next, a method for forming a film with the film forming apparatus 100 will be described in more detail with reference to FIG. 3 to FIG. 5. FIG. 3 is a flow chart showing an exemplary film forming method. FIG. 4 and FIG. 5 are views showing a main process of the film forming method according to this embodiment. The film forming method according to this embodiment includes, for example, placing a wafer W having a patterned insulating film in the processing container 1 of the film forming apparatus 100 (STEP 1), feeding $H_2$ gas into the processing container 1 to condition the processing container 1 (STEP 2), and feeding a mixture gas of $H_2$ gas and $Zr(BH_4)_4$ gas into the processing container 1 to deposit a $ZrB_x$ film on a surface of an insulating film using a CVD (STEP 3).

(STEP 1)

In STEP 1, the wafer W to be processed, which is provided with an insulating film, is placed in the processing container 1 of the film forming apparatus 100. Specifically, the wafer W is carried into the processing container 1 through the opening 25 of the film forming apparatus 100, and is then transferred to the lift pins (not shown) of the stage 3. Then, the lift pins are descended to load the wafer W on the stage 3. As shown in FIG. 4, on the wafer W are formed a base film 80 and an insulating film 81 stacked thereon. The insulating film 81 is formed with a predetermined pattern of unevenness and has an opening 83 (for example, a concave portion such as a trench, or a through hole). Although a single opening 83 is shown in FIG. 4, the number of openings may be two or more.

The insulating film 81 is an interlayer insulating film having, for example, a multilayered wiring structure and the opening 83 is a portion to be a wiring groove or a via hole in a later process. An example of the insulating film 81 may include a low-permittivity film made of material such as $SiO_2$, SiN, SiCOH, SiOF, CFy (y is a positive number), BSG, HSQ, porous silica, SiOC, MSQ, porous MSQ, porous SiCOH or the like.

(STEP 2)

In STEP 2, $H_2$ gas is fed into the processing container 1 to condition the processing container 1. The conditioning may be performed by introducing $H_2$ gas from the gas source 19 into the processing container 1 through the gas feeding pipes 15b and 15b1 and the gas diffusion space 12 and gas discharge holes 13 of the shower head 11. A flow rate of $H_2$ gas is substantially proportional to an area of the wafer W (there is a need to adjust the flow rate of $H_2$ gas depending on the volume of the processing container 1 or capability of the exhauster 35), which is similar to a subsequent film forming step. For example, if the wafer W having a diameter of 100 mm is processed, the flow rate of $H_2$ gas may be set to fall within a range of 12 sccm (mL/min) to 64 sccm (mL/min). Since the conditioning can stabilize the internal temperature, pressure and atmosphere of the processing container 1, a desired $ZrB_x$ film can be formed in a subsequent film forming step. In addition, the conditioning can decrease a deviation of process between wafers. The conditioning step of STEP 2 is optional but is preferably performed since it can stabilize conditions of the film forming process and maintain uniformity of process between wafers.

(STEP 3)

In STEP 3 as a film forming step, a $ZrB_x$ film 87 is formed on the surface of the insulating film 81 using a CVD, as shown in FIG. 5. That is, this step is a step of feeding a mixture gas of $H_2$ gas and $Zr(BH_4)_4$ gas into the processing container 1 and depositing the $ZrB_x$ film 87 on the surface of the insulating film 81. In STEP 3, the $H_2$ gas is fed from the gas source 19 into the raw material container 21 via the gas feeding pipe 15a while controlling its flow rate by means of the mass flow controller 17a. At this time, it is preferable to cool and maintain the interior of the raw material container 21 within a temperature range in which solid $Zr(BH_4)_4$ can be stabilized, for example, within a temperature range of −15° C. to 5° C., so that a useless decomposition side reaction cannot occur in the raw material container 21. If $Zr(BH_4)_4$ is stabilized by the $H_2$ gas, it may be maintained at a temperature of 45° C. or less at which no significant decomposition reaction occurs. Solid raw material $Zr(BH_4)_4$ is evaporated by contact with the introduced $H_2$ gas in the raw material container 21. Then, film forming gas, that is, a mixture gas of $H_2$ gas and $Zr(BH_4)_4$ gas, is introduced into the processing container 1 through the gas feeding pipes 15c and 15c1 and the gas diffusion space 12 and gas discharge holes 13 of the shower head 11 and fed to the wafer W. This results in formation of the $ZrB_x$ film 87 to cover the surface of the insulating film 81 in the processing container 1 using a thermal CVD.

<Film Formation Conditions>

Now, preferred conditions for the formation of the $ZrB_x$ film using the CVD in STEP 3 will be described in detail.

(Film Forming Gas)

In the film forming method according to this embodiment, a mixture gas of $H_2$ gas and $Zr(BH_4)_4$ gas is used as a film forming gas. A flow rate of $H_2$ gas is not particularly limited but may be properly changed depending on the volume of the processing container 1 or a size of the wafer W. For example, if a wafer W having a diameter of 100 mm is processed, the flow rate of $H_2$ gas may be preferably set to fall within a range of 12 sccm (mL/min) to 64 sccm (mL/min), more preferably a range of 20 sccm (mL/min) to 40 seem (mL/min). In addition, a flow rate of $Zr(BH_4)_4$ gas is not particularly limited but may be properly changed depending on the volume of the processing container 1 or a size of the wafer W. For example, if a wafer W having a diameter of 100 mm is processed, the flow rate of $Zr(BH_4)_4$ gas may be preferably set to fall within a range of 3 sccm (mL/min) to 16 sccm (mL/min), more preferably a range of 5 sccm (mL/min) to 8 sccm (mL/min).

A ratio of flow rates of the film forming gas is an important factor in maintaining a B/Zr ratio of the $ZrB_x$ film within a range appropriate as a barrier film (that is, x=1.8 to 2.5). In this respect, a volume ratio of flow rates of the $H_2$ gas and $Zr(BH_4)_4$ gas ($H_2/M(BH_4)_4$ ratio) may be 2 or more, preferably 2.5 to 10, more preferably 3.3 to 7.7. If the $H_2/M(BH_4)_4$ ratio is less than 2, x in the $ZrB_x$ film increases (that is, B becomes excessive) and accordingly the film is greatly deviated from a proper stoichiometric ratio, which results in a low quality barrier film. On the contrary, if the $H_2/M(BH_4)_4$ ratio exceeds 10, x in the $ZrB_x$ film approaches a stoichiometric ratio of 2 but a film forming rate becomes low providing low practicability.

In the film Ruining apparatus 100 according to this embodiment, by evaporating solid raw material $Zr(BH_4)_4$ using the $H_2$ gas under a stable temperature environment in the raw material container 21 having the temperature regulator 23, the $Zr(BH_4)_4$ gas can be fed into the processing container 1 with little decomposition side reaction while easily adjusting the $H_2/Zr(BH_4)_4$ ratio to 2 or more. For example, assuming that P1 is a total pressure which is an addition of vapor pressures of $H_2$ gas and $Zr(BH_4)_4$ gas at a maintenance temperature in the raw material container 21, P2 is a vapor pressure of $Zr(BH_4)_4$ gas and F1 is a flow rate of $H_2$ gas, a flow rate F2 of the evaporated $Zr(BH_4)_4$ gas may be expressed by the following chemical formula (i).

$$F2=[P2/(P1-P2)]\times F1 \qquad (i)$$

As apparent from this formula, the flow rate F2 of the $Zr(BH_4)_4$ gas can be determined by adjusting the flow rate F1 of the $H_2$ gas and the total pressure P1 in the raw material container 21, and accordingly the $H_2/Zr(BH_4)_4$ ratio can be easily controlled.

(Processing Pressure)

A processing pressure in the $ZrB_x$ film forming process is set to, for example, 10 Pa to 300 Pa, preferably 25 Pa to 100 Pa, more preferably 30 Pa to 70 Pa. A film forming speed tends to increase as the processing pressure increases, and the film forming speed tends to decrease as the processing pressure decreases. Therefore, if the processing pressure is lower than 10 Pa, the film forming speed may not be sufficient. On the contrary, if the processing pressure exceeds 300 Pa, the film forming speed may be too high, which may result in a B/Zr ratio exceeding 2.5 and hence peeling out of the $ZrB_x$ film.

(Processing Temperature)

A processing temperature (wafer W heating temperature) in the $ZrB_x$ film forming process is set to, for example, 160° C. to 300° C., preferably 180° C. to 250° C. The film forming speed tends to increase as the processing temperature increases, and the film forming speed tends to decrease as the processing temperature decreases. Therefore, if the wafer W heating temperature is lower than 160° C., the film forming speed may not be sufficient, which may result in low throughput. On the contrary, if the wafer W heating temperature exceeds 300° C., the film forming speed may be too high, which may result in a B/Zr ratio exceeding 2.5 and hence peeling out of the $ZrB_x$ film.

In the film forming apparatus 100, by combining the conditions of the above-mentioned ranges of gas flow rate, processing pressure and processing temperature, the $ZrB_x$ film can be formed on a Cu film at a speed of 3 nm/min to 80 nm/min, or on $SiO_2$ film at a speed of 1 nm/min to 25 nm/min, for example. The film formation conditions may be stored as recipes in the storage 73 of the control unit 70. Then, the controller 71 may read the recipes and send control signals to end devices of the film forming apparatus 100, so that the film forming process can be performed under desired conditions in the film forming apparatus 100.

The $ZrB_x$ film 87 formed through the above-described steps STEP 1 to STEP 3 can act as a barrier film to prevent Cu from being diffused into the insulating film 81 after the opening 83 is filled with a Cu wiring or a Cu plug. The thickness of the $ZrB_x$ film 87 is, for example, 0.5 to 7 nm, preferably 1 to 3 nm since it can maintain barrier capability and suppress an increase in a RC product.

In addition, the film forming method according to this embodiment provides good step coverage. For example, assuming that $T_T$ is a thickness of the $ZrB_x$ film 87 formed on portions other than the opening 83 of the insulating film 81 in FIG. 5 (top film thickness), $T_S$ is a thickness of the $ZrB_x$ film 87 formed on a side of the opening 83 (side film thickness), and $T_B$ is a thickness of the $ZrB_x$ film 87 formed on the bottom of the opening 83 (bottom film thickness), the film may be formed to establish a relationship of $0.8 \times T_T \leq T_S$ and a relationship of $0.8 \times T_T \leq T_B$.

In addition, the $ZrB_x$ film 87 formed by the film forming method of this embodiment has good adhesion with the insulating film 81. In addition, the $ZrB_x$ film 87 has a relatively higher resistance if it is deposited on an insulating film and relatively lower resistance if it is deposited on a conductive film. For example, if a metal film (not shown) of a lower layer wiring such as a Cu film is exposed to the bottom of the opening 83, the metal film can be electrically conducted with a wiring buried in the opening 83 even with the $ZrB_x$ film 87 interposed therebetween.

In addition to the steps STEP 1 to STEP 3, the film forming method of this embodiment may include any other steps such as, for example, a step of modifying the surface of the insulating film 81, a sputtering step by Ar plasma, etc.

Next, results of experiments forming the basis of the present disclosure will be described,
(Examination on Processing Temperature)

$ZrB_x$ films were formed on different base films while changing a processing temperature. The processing temperature was set to 160° C., 200° C., 250° C. or 300° C. A flow rate of film forming gas was set to 20 mL/min (sccm) for $H_2$ gas and 6 mL/min (sccm) for $Zr(BH_4)_4$ gas. A $H_2/Zr(BH_4)_4$ ratio was 3.3. A processing pressure was set to 50 Pa. The base films used were a Ta film, a Cu film, a low-k film (CORAL (trade mark) available from Novellus Company) and a $SiO_2$ film. FIGS. 6 to 9 are graphs showing the results at processing temperatures of 160° C., 200° C., 250° C. and 300° C., respectively. In addition, since a film forming speed was too high in a preliminary experiment, the flow rate of the $Zr(BH_4)_4$ gas was set to 2.6 mL/min (sccm) only for the processing temperature of 300° C. In FIGS. 6 to 9, the horizontal axis represents film formation time [min], and film thickness [nm] on the vertical axis was plotted for each base film. The film thickness was measured by a scanning electron microscope (SEM) if it was relatively large (about 15 nm or more) and was measured by fluorescent X-ray analysis (XRF) if it was relatively small (below about 15 nm).

Figure 6:
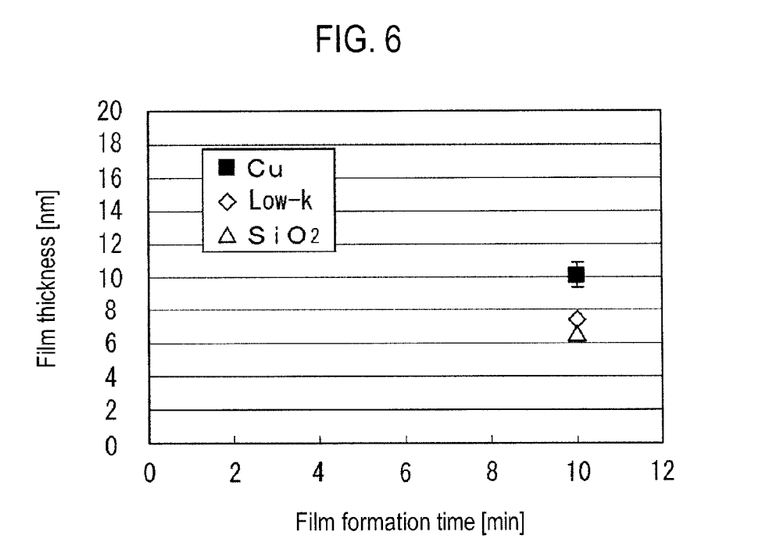
FIG. 6 is a graph showing a relationship between film formation time and thickness of a $ZrB_x$ film at a processing temperature of 160° C.
Figure 7:
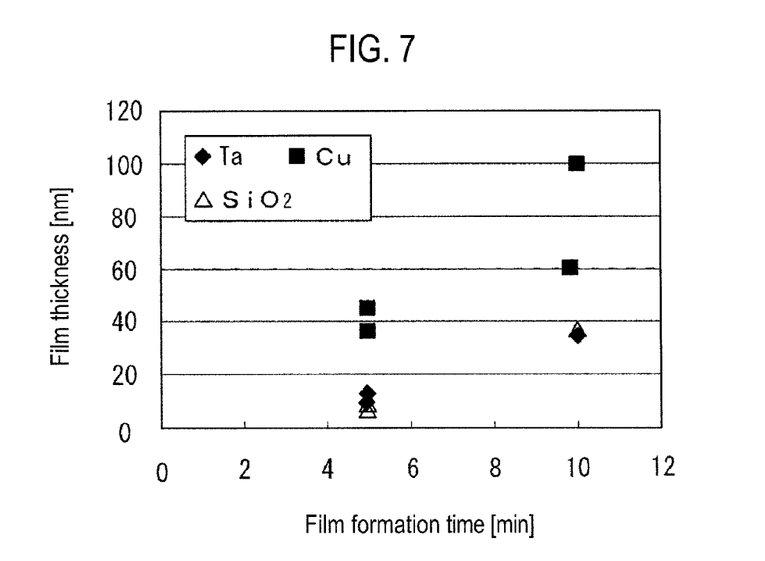
FIG. 7 is a graph showing a relationship between film formation time and thickness of a $ZrB_x$ film at a processing temperature of 200° C.
Figure 8:
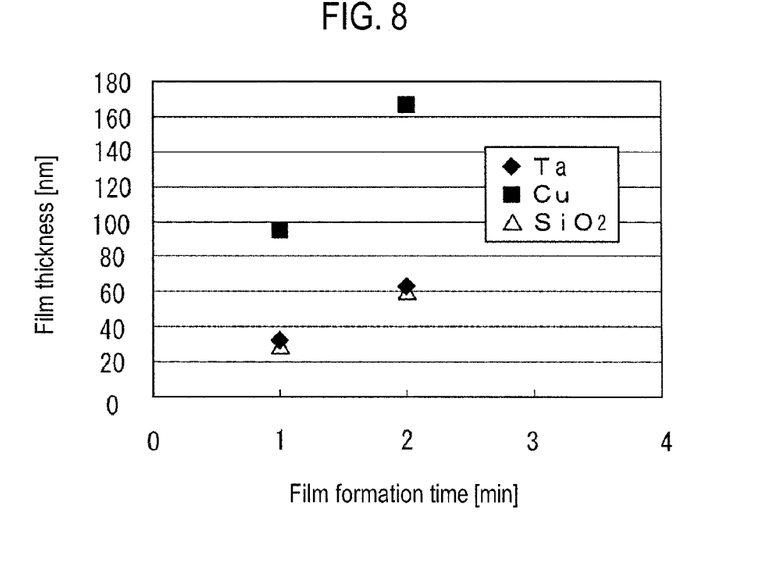
FIG. 8 is a graph showing a relationship between film formation time and thickness of a $ZrB_x$ film at a processing temperature of 250° C.
Figure 9:
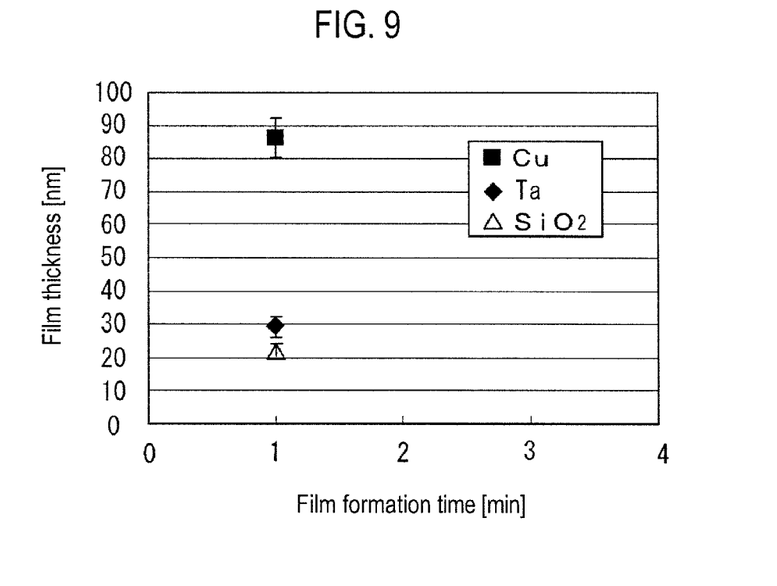
FIG. 9 is a graph showing a relationship between film formation time and thickness of a $ZrB_x$ film at a processing temperature of 300° C.

First, from FIGS. 6 and 9, it can be seen that a film forming speed for any base film is too low for the processing temperature of 160° C. and conversely is too high for 300° C. (where the flow rate of $Zr(BH_4)_4$ gas is half of those for other processing temperatures), which is inappropriate to form the $ZrB_x$ film at a thickness of 0.5 to 9 nm to be used as a barrier film. In comparison, from FIGS. 7 and 8, it can be seen that the processing temperature of 200° C. to 250° C. is appropriate to form the $ZrB_x$ film at a thickness of several to several tens nm. In addition, it is considered that a processing temperature slightly lower than 200° C. is also preferable to form the $ZrB_x$ film at a thickness of 1 to 3 nm targeted for a barrier film.

Figure 10:
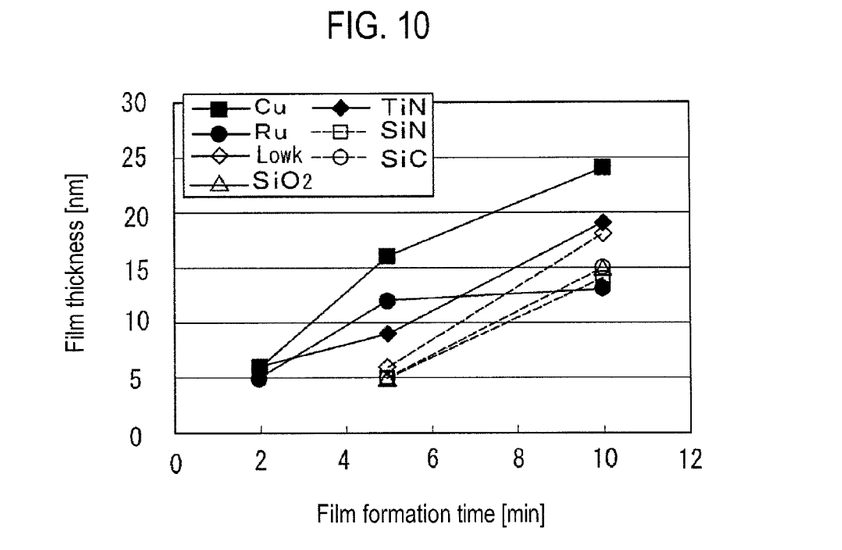
FIG. 10 is a graph showing a relationship between film formation time and thickness of a $ZrB_x$ film at a processing temperature of 180° C.
Figure 11:
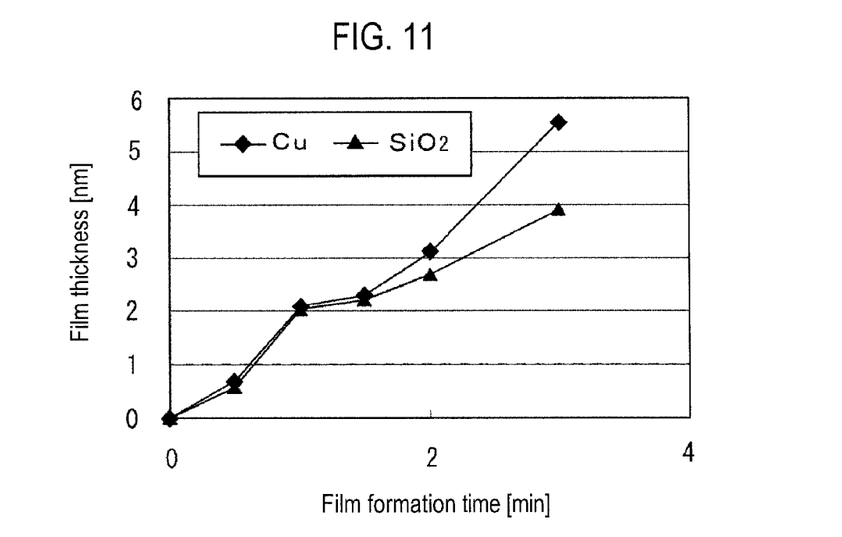
FIG. 11 is another graph showing a relationship between film formation time and thickness of a $ZrB_x$ film at a processing temperature of 180° C.

Based on the above results, $ZrB_x$ films were formed on different base films with a processing temperature fixed at 180° C. The base films used were a Cu film, an Ru film, a low-k film (CORAL (trade mark) available from Novellus Company), a TiN film, a SiN film, a SiC film and a $SiO_2$ film. A flow rate of film forming gas was set to 20 mL/min (sccm) for $H_2$ gas and 6 mL/min (sccm) for $Zr(BH_4)_4$ gas. A $H_2/Zr(BH_4)_4$ ratio was 3.3. A processing pressure was set to 50 Pa.

In graphs of FIGS. 10 and 11, the horizontal axis represents film formation time [min] and film thickness [nm] on the vertical axis was plotted for each base film. FIG. 10 shows the results of measurement of film thickness by a scanning electron microscope (SEM) and FIG. 11 shows the results of measurement of film thickness by fluorescent X-ray analysis (XRF). From FIGS. 10 and 11, it can be seen that the thickness of the $ZrB_x$ film increases substantially in proportion to film formation time within a thickness range of 0.5 to 20 nm Therefore, it can be seen that the $ZrB_x$ film can be formed with good controllability at a thickness of 1 to 3 nm targeted for a barrier layer if the film formation temperature falls within the range of 180° C. to 250° C.

(Examination on Processing Temperature)

$ZrB_x$ films were formed using a Ta film and a $SiO_2$ film as base films while changing a processing pressure to 25 Pa, 50 Pa or 100 Pa. A flow rate of film forming gas was set to 20 mL/min (sccm) for $H_2$ gas and 6 mL/min (sccm) for $Zr(BH_4)_4$ gas. A $H_2/Zr(BH_4)_4$ ratio was 3.3. A processing temperature was set to 250° C. and film forming time was set to 5 minutes. As a result, although metallic-lustering $ZrB_x$ films could be formed on the base films at any processing pressure, there were some cases where the $ZrB_x$ films were peeled out at 100 Pa due to an excessive amount of film formation. In addition, since a film forming speed tends to increase with an increase in the processing pressure, it is considered that a processing pressure is preferably 100 Pa or less which does not significantly increase the film forming speed in view of the controllability of the thickness of the $ZrB_x$ film. Accordingly, from the result of this experiment, although the processing pressure preferably falls within a range of 25 Pa to 100 Pa in forming the $ZrB_x$ film, it is considered that the processing pressure most preferably falls within a range of 30 Pa to 70 Pa.

(Examination on Flow Rate of Raw Material Gas)

$ZrB_x$ films were formed using Ta, Cu and $SiO_2$ films as base films with a flow rate of $H_2$ gas fixed at 20 mL/min (sccm) and a flow rate of $Zr(BH_4)_4$ gas set to 2.6 mL/min (sccm) [$H_2/Zr(BH_4)_4$ ratio: 7.7], 6 mL/min (sccm) [$H_2/Zr(BH_4)_4$ ratio: 3.3] or 15.5 mL/min (sccm) [$H_2/Zr(BH_4)_4$ ratio: 1.3]. All processing pressures were set to 50 Pa. A processing temperature was set to 250° C. and film forming time was set to 5 minutes. As a result, metallic-lustering $ZrB_x$ films could be formed on the base films at any flow rate of raw material gas.

(Examination on Film Formation Conditions)

Figure 12:
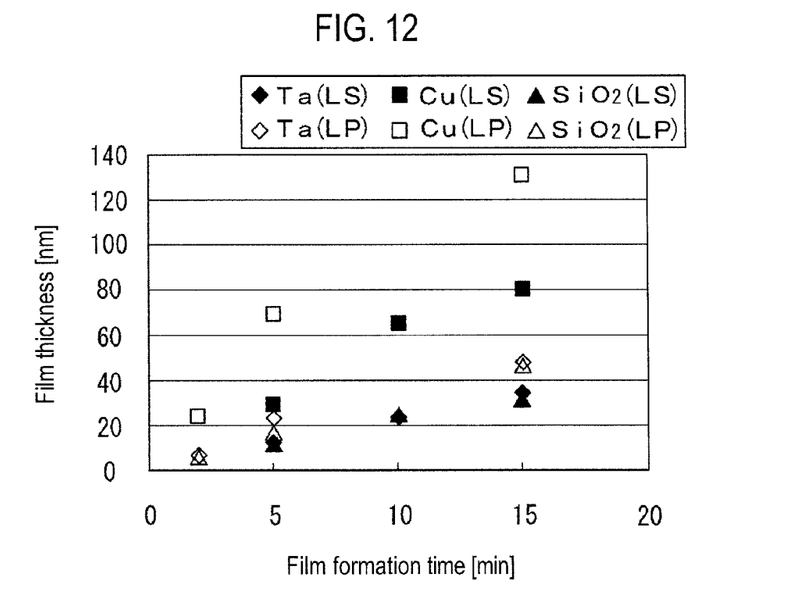
FIG. 12 is a graph showing a relationship between film formation time and thickness of a $ZrB_x$ film at a processing temperature of 200° C. in an experiment with a changed process pressure and a changed flow rate of $Zr(BH_4)_4$.
Figure 13:
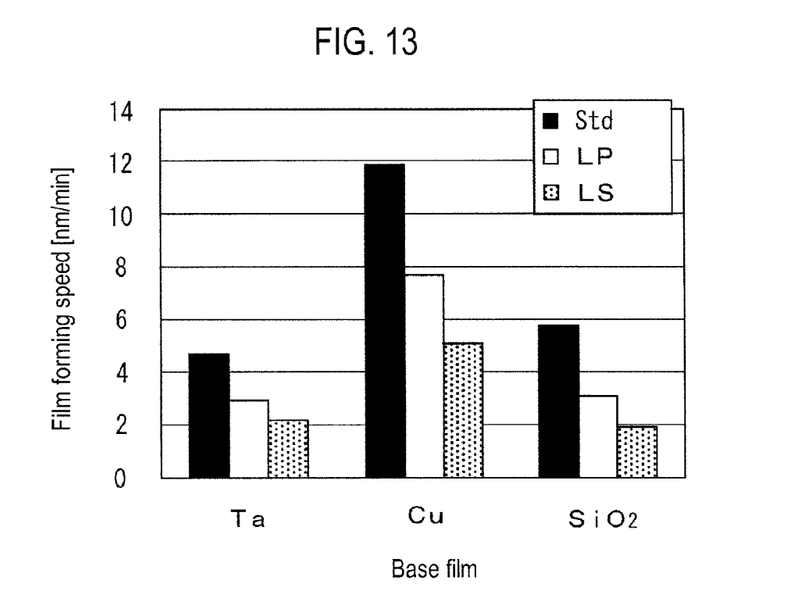
FIG. 13 is a graph showing a relationship between a type of a base film and a film formation speed at a processing temperature of 200° C. in an experiment with a changed process pressure and a changed flow rate of $Zr(BH_4)_4$.

Based on the results of the experiment for the processing temperature, processing pressure and flow rate of raw material gas, film formation conditions were examined. $ZrB_x$ films were formed on different base films while changing a flow rate and pressure of film forming gas ($H_2$ gas and $Zr(BH_4)_4$ gas). Ta, Cu and $SiO_2$ films were used as the base films. A processing temperature was set to 200° C. The flow rate of film forming gas was fixed at 20 mL/min (seem) for $H_2$ gas and set to 2.6 mL/min (sccm) or 6 mL/min (sccm) for $Zr(BH_4)_4$ gas. An processing pressure was set to 25 Pa or 50 Pa.

Here, film formation conditions were set as follows.
Standard conditions (Std): Combination of a flow rate of 6 mL/min (sccm) for $Zr(BH_4)_4$ gas and a processing pressure of 50 Pa.
Low pressure conditions (LP): Combination of a flow rate of 6 mL/min (sccm) for $Zr(BH_4)_4$ gas and a processing pressure of 25 Pa.
Low raw material conditions (LS): Combination of a flow rate of 2.6 mL/min (sccm) for $Zr(BH_4)_4$ gas and a processing pressure of 50 Pa.

In the graph of FIG. 12, the horizontal axis represents film formation time [min] and film thickness [nm] on the vertical axis was plotted for each base film. In the bar graph of FIG. 13, the horizontal axis represents a type of base film and the vertical axis represents a film forming speed. From FIG. 12, it can be seen that the thickness of the $ZrB_x$ film tends to increase with an extension of film forming time and shows a big difference depending on the type of base film. In addition, from FIG. 13, it can be seen that a film forming speed is higher in the low pressure conditions (LP) than in the low raw material conditions (LS) for any base film and the standard conditions (Std) provides the highest film forming speed. Thus, the film forming speed can be adjusted depending on the processing pressure and the flow rate of $Zr(BH_4)_4$ gas. In addition, it can be seen that the standard conditions where the flow rate of $Zr(BH_4)_4$ gas is 6 mL/min (sccm) and the processing pressure is 50 Pa are most preferable in view of the film forming speed.

(Analysis on Film Component)

Figure 14:
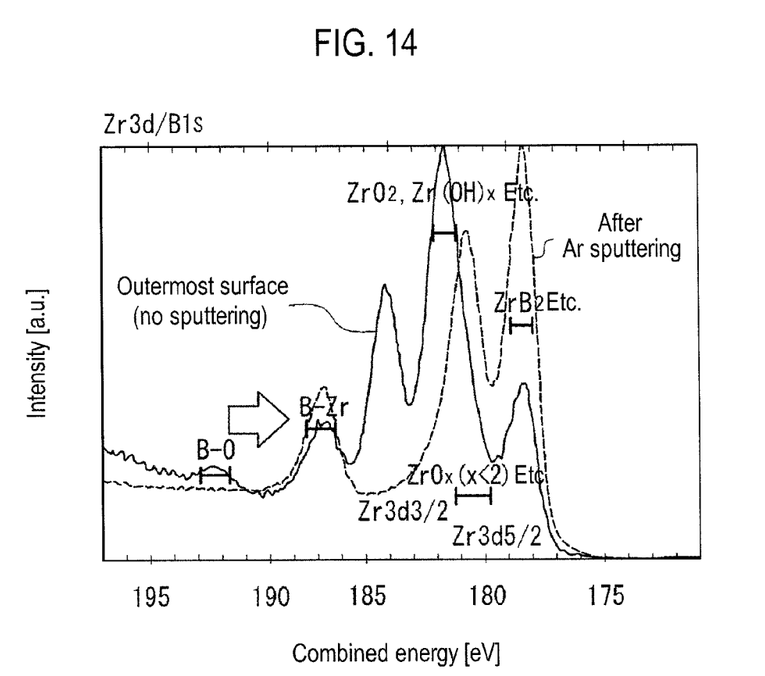
FIG. 14 is a chart showing a result of XPS analysis on a $ZrB_x$ film.

Next, an analysis of components of $ZrB_x$ films formed at a thickness of 100 nm or more on Ta and $SiO_2$ films using the film forming apparatus 100 was made by X-ray photoelectron spectroscopy (XPS). The $ZrB_x$ films were formed at a processing temperature of 200° C. for 15 minutes, a processing temperature of 250° C. for 5 minutes, or a processing temperature of 300° C. for 2 minutes. A flow rate of $H_2$ gas, a flow rate of $Zr(BH_4)_4$ gas and a processing pressure were set to 20 mL/min (sccm), 6 mL/min (sccm) and 50 Pa, respectively. In addition, an analysis of samples with their surface layers removed by Ar sputtering to remove natural oxide films formed thereon was made.

Figure 15:
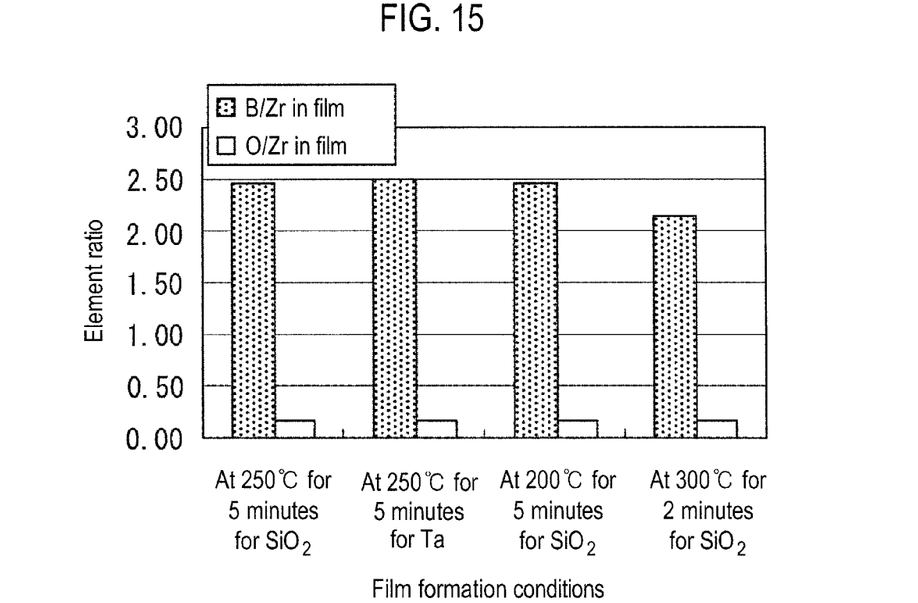
FIG. 15 is a graph showing a result of analysis on a B/Zr ratio and an O/Zr ratio of a $ZrB_x$ film formed under different conditions.

FIG. 14 is a chart showing a result of XPS analysis on a $ZrB_x$ film formed on a $SiO_2$ film at a processing temperature of 250° C. for 5 minutes. From FIG. 14, it can be seen from the sample subjected to Ar sputtering that the interior of the $ZrB_x$ film is nearly formed by $ZrB_x$ although the outermost surface of the $ZrB_x$ film (a surface not subjected to Ar sputtering) has a peak of $ZrO_2$ or $Zr(OH)_x$ and is oxidized. In addition, FIG. 15 shows a B/Zr ratio and an O/Zr ratio of a $ZrB_x$ film formed under the conditions of different temperatures and types of base films ($SiO_2$ and Ta films). From FIG. 15, it can be confirmed that the B/Zr ratio of the $ZrB_x$ film falls within a range of 2.1 to 2.5, which is close to a proper stoichiometric ratio, within a processing temperature range of 200° C. to 300° C., which is one of the experiment conditions. In addition, the content of oxygen in the $ZrB_x$ film was about 5%.

(Evaluation of Step Coverage)

Next, step coverage was evaluated by forming a $ZrB_x$ film on a $SiO_2$ film having a hole with an opening diameter of 120 nm and an aspect ratio of 1.5 to 4 or a trench with an opening width of 120 nm and an aspect ratio of 1.5 to 4. The $ZrB_x$ film was formed at a processing temperature of 200° C. for 15 minutes (a desired film thickness is 20 to 21 nm), or a processing temperature of 250° C. for 5 minutes (a desired film thickness is 125 to 130 nm). A flow rate of $H_2$ gas, a flow rate of $Zr(BH_4)_4$ gas and a processing pressure were set to 20 mL/min (sccm), 6 mL/min (sccm) and 50 Pa, respectively.

Figure 16:
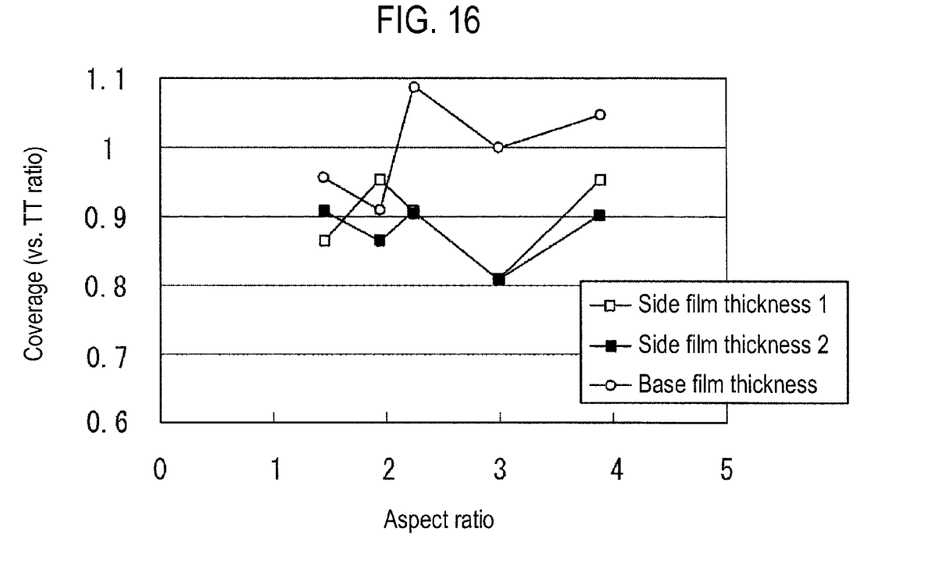
FIG. 16 is a graph showing a result of measurement of step coverage for a hole having an aspect ratio of 1.5 to 4.
Figure 17:
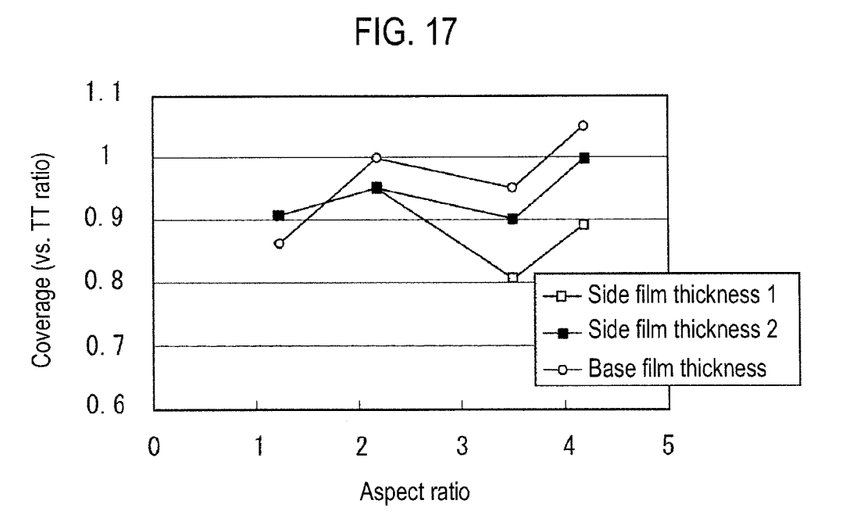
FIG. 17 is a graph showing a result of measurement of step coverage for a trench having an aspect ratio of 1.5 to 4.

FIG. 16 shows the results of measurement of step coverage for a hole having an aspect ratio of 1.5 to 4. FIG. 17 shows the results of measurement of step coverage for a trench having an aspect ratio of 1.5 to 4. From FIG. 16 and FIG. 17, it can be seen that a ratio ($T_S/T_T$) of side film thickness ($T_S$) to top film thickness ($T_T$) is 0.8 or more for the hole and 0.8 or more for the trench, and a ratio ($T_B/T_T$) of bottom film thickness ($T_B$) to top film thickness ($T_T$) is 0.9 or more for the hole and 0.85 or more for the trench. Thus, it is confirmed that the film forming method of this embodiment provide good step coverage.

<Operation>

In the film forming method of this embodiment, $H_2$ gas is used as a carrier gas to evaporate and guide solid raw material $Zr(BH_4)_4$ into the processing container 1. The $H_2$ gas acts as a carrier gas simply and has a function of maintaining the processing container 1 under a reducing atmosphere and approaching a B/Zr ratio of a $Zr(BH_4)_4$ film formed in connection with a film forming reaction to a proper stoichiometric ratio. That is, typically, a thermal decomposition reaction such as the following chemical formula 1 is generated on a wafer W heated to a predetermined temperature in forming a film using a thermal CVD with $Zr(BH_4)_4$ gas as raw material.

$Zr(BH_4)_4 \rightarrow ZrB_2 + B_2H_6 + 5H_2$     [Chemical Formula 1]

However, in the film forming step STEP 3 in the film forming method of this embodiment, it is considered that a thermal decomposition reaction such as the following chemical formula 2 is generated on a wafer W heated to a predetermined temperature, since excessive $H_2$ gas and $Zr(BH_4)_4$ gas are mixed and introduced into the processing container 1.

$Zr(BH_4)_4 + nH_2 \rightarrow ZrB_2 + B_2H_6 + (5+n)H_2$     [Chemical Formula 2]

Although the role of $H_2$ in Chemical Formula 2 is not necessarily definitely elucidated, it is considered that the excessive existence of $H_2$ with regard to $Zr(BH_4)_4$ promotes the generation of $B_6H_6$ (consumption of boron), thereby suppressing excessive boron from remaining in the $ZrB_x$ film. In the film forming method of this embodiment, in order to sufficiently draw such an effect of the addition of $H_2$ gas, a volume ratio of the flow rates of the $H_2$ gas and $Zr(BH_4)_4$ gas ($H_2/M(BH_4)_4$ ratio) is set to 2 or more, preferably 2.5 to 10, more preferably 3.3 to 7.7. This can achieve a $ZrB_x$ film having a B/Zr ratio of 1.8 to 2.5 and good electrical properties and barrier-capability, which was difficult to achieve using conventional thermal CVD methods using a processing temperature of 300° C.

As described above, in the film forming method of this embodiment, by evaporating solid raw material $Zr(BH_4)_4$ using $H_2$ gas as a carrier gas and introducing a mixture gas of $H_2$ gas and $Zr(BH_4)_4$ gas having a volume ratio of flow rates ($H_2/Zr(BH_4)_4$) of 2 or more into the processing container 1, it is possible to form a $ZrB_x$ film having a proper range of B/Zr ratio (that is, x is 1.8 to 2.5) close to a stoichiometric ratio without requiring remote plasma. This makes it possible to simplify a configuration of a film forming apparatus as compared to conventional methods requiring remote plasma.

In addition, according to the film forming method of this embodiment, it is possible to achieve a $ZrB_x$ film 87 formed uniformly at a predetermined thickness on an insulating film 81. In addition, it is possible to achieve a $ZrB_x$ film 87 having good step coverage and formed substantially at a uniform thickness in an opening 83 which is formed in an insulating film 81 and has a large aspect ratio, i.e., a large ratio of depth to opening diameter. The $ZrB_x$ film 87 obtained thus has good electrical properties and good barrier-capability to Cu diffusion. In other words, the $ZrB_x$ film 87 formed according to the film forming method of this embodiment can secure electrical connection between wirings and effectively prevent Cu from being diffused from a copper wiring into the insulating film 81 in a semiconductor device. Accordingly, by forming the $ZrB_x$ film 87 as a barrier film according to the film forming method of this embodiment, it is possible to secure reliability of the semiconductor device.

[Application to Damascene Process]

Figure 18:
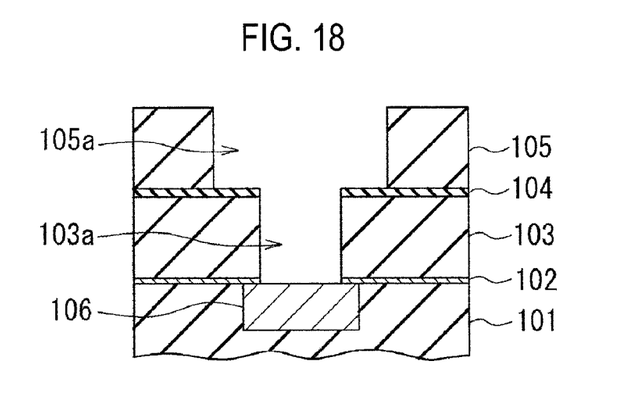
FIG. 18 is a sectional view showing a wafer surface, which is used to explain a film forming process applied to a damascene process, according to an embodiment of the present disclosure.

Next, an application of the film forming method of this embodiment to a damascene process will be described with reference to FIGS. 18 to 20. FIG. 18 is a sectional view of a main portion of a wafer W, showing a stack before a ZrBx film 87 is formed. On an interlayer insulating film 101 as a base wiring layer is formed an etching stopper film 102, an interlayer insulating film 103 as a via layer, an etching stopper film 104 and an interlayer insulating film 105 as a wiring layer in order. In addition, a lower wiring layer 106 in which Cu is buried is formed on the interlayer insulating film 101. The etching stopper films 102 and 104 have barrier-capability to prevent copper from being diffused. The interlayer insulating films 103 and 105 are low-k films formed using, for example, a CVD. The etching stopper films 102 and 104 may be silicon carbide (SiC) films, silicon nitride (SiN) films, silicon carbonitride (SiCN) films or the like formed using, for example, a CVD.

As shown in FIG. 18, openings 103a and 105a are formed with their respective patterns in the interlayer insulating films 103 and 105, respectively. These openings 103a and 105a may be formed by etching the interlayer insulating films 103 and 105 into predetermined patterns using a photolithograpy process in a typical manner. The opening 103a is a via hole and the opening 105 is a wiring groove. The opening 103a reaches the top of the lower wiring layer 106 and the opening 105a reaches the top of the etching stopper film 104.

Figure 19:
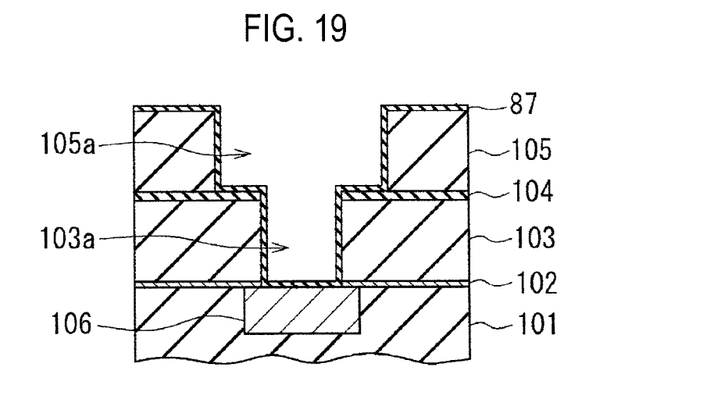
FIG. 19 is a continuation of FIG. 18, which is a sectional view showing a main portion of a wafer surface with a $ZrB_x$ film formed thereon.

Next, FIG. 19 shows the stack of FIG. 18 under a state after the $ZrB_x$ film 87 is formed using the film forming apparatus 100 by means of a CVD. In the film forming process, by performing a thermal CVD under the above film formation conditions, it is possible to form a $ZrB_x$ film 87 having good adhesion to the interlayer insulating films 103 and 105 at a uniform thickness and having good step coverage even when the openings 103a and 105a have high aspect ratios.

Figure 20:
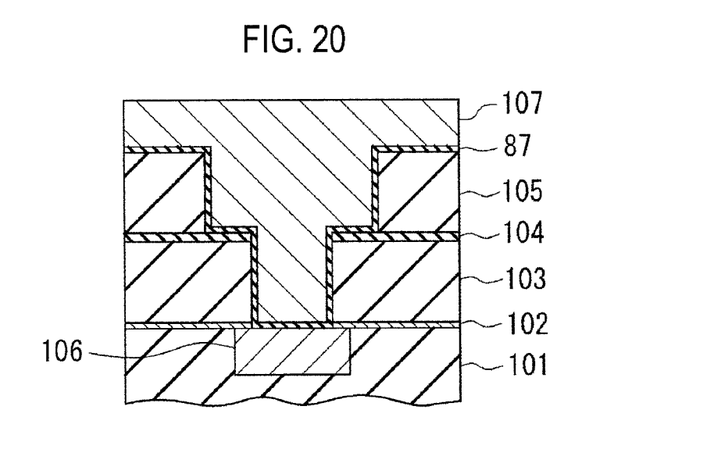
FIG. 20 is a continuation of FIG. 19, which is a sectional view showing a main portion of a wafer surface with a Cu film burred therein.

Next, as shown in FIG. 20, a Cu film 107 is formed to be filled in the openings 103a and 105a by depositing Cu on the interlayer insulating film 105. The Cu film 107 may be formed using, for example, a CVD, a PVD, a plating method or the like. The Cu film 107 filled in the opening 103a becomes a Cu plug and the Cu film 107 filled in the opening 105 becomes a Cu wiring. Subsequently, an excess of Cu film 107 is removed through a planarization process by a chemical mechanical polishing (CMP) in a typical manner, thereby completing a multilayer wiring structure having the Cu plug and the Cu wiring.

In the multilayer wiring structure formed thus, since the $ZrB_x$ film 87 has good barrier-capability, it is possible to prevent Cu from being diffused from the Cu film 107 into the interlayer insulating films 103 and 105. In addition, since the $ZrB_x$ film 87 becomes a low resistant film by forming it on the lower wiring layer 106 at the bottom of the opening 103a, it is possible to secure an electrical contact between the Cu film 107 filled in the openings 103a and 105a and the lower wiring layer 106. Thus, it is possible to manufacture electronic components having a multilayer wiring structure having high reliability.

Although it has been illustrated in the above that the film forming method is applied to a dual damascene process, this method may be equally applied to a single damascene process.

Although the exemplary embodiment of the present disclosure has been described and shown, the present disclosure may be modified in various ways without be limited to the disclosed embodiment. For example, although the disclosed embodiment has been illustrated with a semiconductor wafer as a substrate to be processed, the present disclosure is not limited thereto but may be applied to other substrates such as a glass substrate, an LCD substrate, a ceramics substrate and so on. In addition, although the disclosed embodiment has been illustrated with the case where M in the $MB_x$ film is Zr, a $HfB_x$ film including Hf as M (which may be typically represented by a $HfB_2$ film) may be formed in the same manner because of its similar chemical property.

According to the film forming method of the present disclosure, by evaporating solid raw material $Zr(BH_4)_4$ using $H_2$ gas as a carrier gas and introducing a mixture of $H_2$ gas and $Zr(BH_4)_4$ gas having a volume ratio of flow rates ($H_2/Zr(BH_4)_4$) of 2 or more into the processing container, it is possible to form a $MB_x$ film having a proper range of B/Zr ratio (that is, x is 1.8 to 2.5) close to a stoichiometric ratio using a thermal CVD without requiring remote plasma. This allows significant simplification of a configuration of a film forming apparatus as compared to conventional methods requiring remote plasma.

In addition, according to the film forming method of the present disclosure, it is possible to achieve a $MrB_x$ film formed uniformly at a predetermined thickness on an insulating film. In addition, it is possible to achieve a $MB_x$ film having good step coverage and formed substantially at a uniform thickness in an opening which is formed in an insulating film and has a large aspect ratio, i.e., a large ratio of depth to opening diameter. The $MB_x$ film obtained thus has good electrical properties and good barrier-capability to Cu diffusion. In other words, the $MB_x$ film formed according to the film forming method of the present disclosure can secure an electrical connection between wirings and effectively prevent Cu from being diffused from a copper wiring into the insulating film in a semiconductor device. Accordingly, by forming the $MB_x$ film as a barrier film according to the film forming method of the present disclosure, it is possible to secure reliability of the semiconductor device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a film, comprising:
   placing an object to be processed into a processing container;
   generating $M(BH_4)_4$ gas by feeding $H_2$ gas as carrier gas into a raw material container in which solid raw material $M(BH_4)_4$ (where M is Zr or Hf) is accommodated;
   introducing a mixture gas of $H_2$ gas and $M(BH_4)_4$ gas into the processing container while controlling a volume ratio of flow rates ($H_2/M(BH_4)_4$) to be 2 or more; and
   depositing a $MB_x$ film (where M is Zr or Hf and x is 1.8 to 2.5) on the object using a thermal CVD without plasma generating equipment.

2. The method of claim 1, wherein depositing the $MB_x$ film includes setting an internal pressure of the processing container to 10 Pa or more to 300 Pa or less.

3. The method of claim 1, wherein depositing the $MB_x$ film includes setting a temperature of the object to 160° C. or more to 300° C. or less.

4. The method of claim 1, wherein the $H_2$ gas is fed while the solid raw material in the raw material container is cooled and maintained in a range of −15° C. to 5° C.

5. A method for manufacturing a semiconductor device, comprising:
   depositing a $MB_x$ film (where M is Zr or Hf and x is 1.8 to 2.5), as a barrier film, on an insulating film of an object to be processed using a film forming method of claim 1; and
   depositing a metal film on the $MB_x$ film.

6. The method of claim 5, wherein the $MB_x$ film is formed to cover at least an inner wall of an opening formed in the insulating film.

* * * * *